United States Patent [19]

Wenger

[11] Patent Number: 4,691,327

[45] Date of Patent: Sep. 1, 1987

[54] CLOCK REGENERATOR

[75] Inventor: Bruno Wenger, Au, Switzerland

[73] Assignee: Siemens Aktiengesellschaft, Berlin & Munich, Fed. Rep. of Germany

[21] Appl. No.: 860,273

[22] Filed: May 6, 1986

[30] Foreign Application Priority Data

Jun. 10, 1985 [CH] Switzerland ............... 02440/85

[51] Int. Cl.$^4$ .......................................... H04L 25/60
[52] U.S. Cl. .................................... 375/4; 375/120; 331/1 A; 328/63
[58] Field of Search ............... 375/4, 81, 82, 119, 375/120; 331/1 A, 23; 307/269, 511; 328/61, 63, 155

[56] References Cited

U.S. PATENT DOCUMENTS

| | | | |
|---|---|---|---|
| 3,936,762 | 2/1976 | Cox, Jr. et al. | 331/23 |
| 4,151,485 | 4/1979 | La Fratta | 331/1 A |
| 4,227,251 | 10/1980 | Kazama et al. | 375/4 |
| 4,280,099 | 7/1981 | Rattlingourd | 375/119 |
| 4,327,356 | 4/1982 | Gilliland | 375/4 |
| 4,400,817 | 8/1983 | Sumner | 375/119 |
| 4,569,064 | 2/1986 | Collin et al. | 375/120 |
| 4,590,602 | 5/1986 | Wolaver | 375/120 |

OTHER PUBLICATIONS

Cessna & Levy, "Phase Noise and Transient Times for a Binary Quantized Digital Phase-Locked Loop in White Gaussian Noise", IEEE Trans. on Comm. vol. COM-20, No. 2, Apr. 1972, pp. 94-104.

Primary Examiner—Robert L. Griffin
Assistant Examiner—Stephen Chin
Attorney, Agent, or Firm—Jeffrey P. Morris

[57] ABSTRACT

A clock regenerator is designed as a phase locked loop (PLL) and comprises a phase detector (DET) which compares the phase of the input signal (Sp) with that of the output signal (Sa), the frequency of the phase detector being approximately N times smaller than the oscillator frequency. In the phase detector (DET), there are obtained from a regenerated output signal (Sa) two signals delayed by L/N periods, wherein L is a small integer, in order to form therefrom a pulse window comprising at least three zones. The clock regenerator comprises a loop filter (FIL) with a counter, the status of which is recorded in a logic circuit which controls a programmable divisor (DIV) in such a way that when the edges of the input pulse (Sp) fall in the central most zone, the counter counts toward zero and no correction is brought about.

3 Claims, 4 Drawing Figures

CLOCK REGENERATOR

BACKGROUND OF THE INVENTION

1. Technical Field

The present invention relates to the field of clock systems for digital telecommunications systems and particularly to a clock regenerator whose phase is corrected through a phase locked loop.

2. Description of the Prior Art

In digital communications technology there are often used, besides passive clock regenerators or clock extractors, active clock regenerators which operate with an additional oscillator signal.

SUMMARY OF THE INVENTION

By the present invention, a specific solution for an active clock regenerator is indicated which operates relatively quickly and has an especially good jitter tolerance.

According to the invention, this is achieved by the measures indicated in the characterizing part of claim 1. In particular, in a phase locked loop clock regenerator system, there is obtained a delayed signal which forms a pulse window comprising at least three zones. A counter increments or decrements based on which zone the edge of the input signal is occupying such that no correction occurs when the edge falls in the central most zone. Advantageous variants of the invention are indicated in the dependent claims.

In the following, the invention will be explained more specifically by a description of embodiments with reference to drawings.

DETAILED DESCRIPTION

Figure 1:
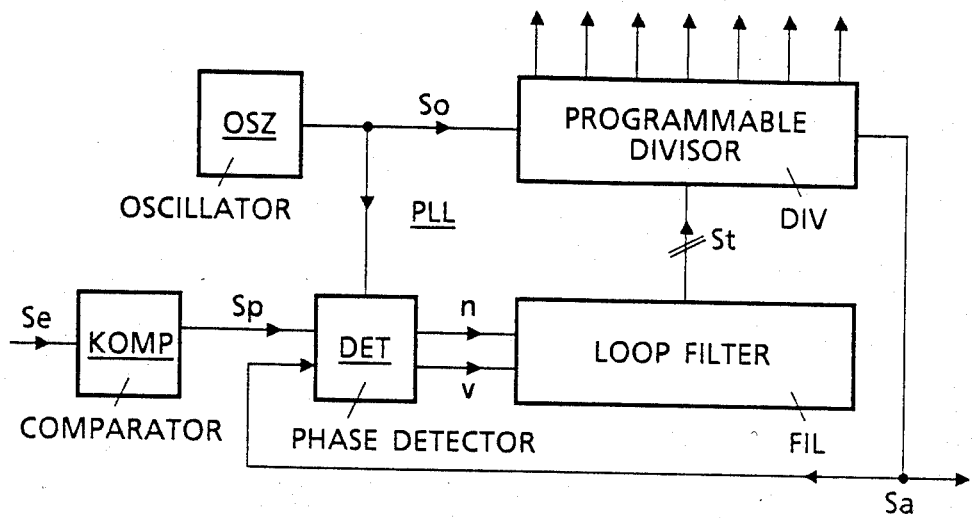
FIG. 1 shows the circuit diagram of a clock regenerator according to the invention.

The clock regenerator according to FIG. 1 comprises a programmable divisor DIV, which is connected to the output of an oscillator OSZ, and whose output signal Sa has a frequency fa which is smaller than the frequency fo of the oscillator signal So by approximately the factor N. The clock regenerator further comprises a comparator circuit KOMP, where a received eye signal Se transforms into pulses Sp, as well as a phase detector DET and a loop filter FIL whose output signal St controls the divisor DIV. The phase detector DET compares the signals Sp and Sa by means of the signal So and delivers two signals n and v, with which the loop filter is controlled.

The clock regenerator according to FIG. 1 is constructed in principle like a phase locked loop (PLL) circuit, so that the principle of its operation is known.

Figure 2:
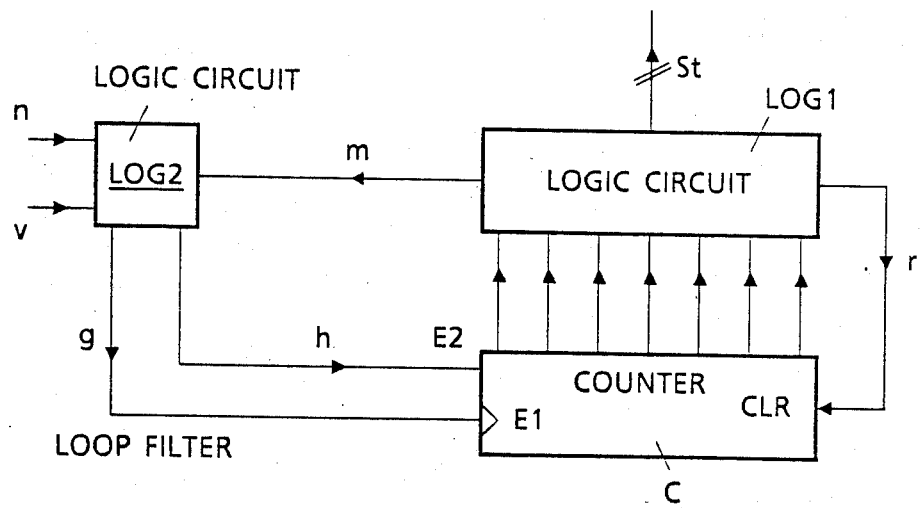
FIG. 2 shows the circuit diagram of a loop filter for such a clock regenerator.

The loop filter according to FIG. 2 comprises a counter C and two logic circuits LOG1 and LOG2, of which the second receives the signals n and v, and the first delivers the control signal St as well as an information signal m for the control of circuit LOG2 and a reset signal r for counter C. On the input side, circuit LOG1 is connected to the various outputs of counter C, the clock input E1 of which receives a first output signal g while its count direction input E2 receives a second output signal h of circuit LOG2.

The clock regenerator according to FIGS. 1 and 2 operates as follows:

The programmable divisor DIV normally divides the output frequency fo of oscillator OSZ (FIG. 1) by N, to obtain a clock signal Sa which has approximately the same frequency fa as the frequency fe of arriving signal Se. The phase detector DET compares the phase of the synthesized pulses Sa with those of the pulses Sp obtained at the output of the comparator circuit KOMP and tests how much the edges of signal Sa arrive before or after the edges of signal Sp.

For this purpose the clock signal Sa undergoes in the phase detector DET a delay of any desired duration, which may also be zero. The resulting clock signal Sa1 (FIG. 3) is then further delayed in such a way that there results a clock signal Sa2 delayed by L/N periods relative to clock signal Sa1, where L is a small integer, preferably L=1. Thus there results the pulse window shown in FIG. 3, with four zones I, II, III and IV, as follows:

Zone I Sa1=0 and Sa2=0
Zone II Sa1=1 and Sa2=0
Zone III Sa1=1 and Sa2=1
Zone IV Sa1=0 and Sa2=1

Every time an ascending edge of the signal Sp arrives, which may be jittered, pulses n and v are generated, namely, depending on the zone I, II, III or IV in which the edge is located, according to the following Rule I:

Zone I n=1 and v=0
Zone II n=1 and v=1
Zone III n=0 and v=1
Zone IV n=0 and v=0

Here, n=0 or v=0 means that at the moment there is no pulse, and n=1 or v=1 means that at the moment there is a pulse, for example, a half bit wide. From the pulses n, v and m are generated by the circuit LOG2 the clock pulse g as well as the signal h serving to control the counting direction. The counter status of counter C is recognized by the circuit LOG1, so that for a positive counting status, for example, the signal m has the value m=1.

The counter C starts to count at a value 0 and counts according to the following Rule II:

With every pulse v=1, the counter C counts in a positive direction by a value X, for example, from +6 to +7 or from −3 to −2, with X=1. With every pulse n=1, the counter counts in negative direction by a value X, for example from −6 to −7 or from +3 to +2, with X=1. When simultaneously v=1 and n=1, the counter counts by a value Y toward zero, for example from +6 to +5 with Y=1 at m=1 or from −6 to −5 at m=0. If no edge arrives, v=0 and n=0 simultaneously, and the counter does not count.

As long as the counter status has not reached a value +K or −K, the control signal St receives the information that the divisor DIV (FIG. 1) is to divide by N. When the counter status reaches the value +K, the control signal St brings it about that the divisor DIV divides by (N+1) instead of by N, as a result of which the frequency fa of clock signal Sa becomes smaller; but when the counter status reaches the value −K, the control signal St brings it about that the divisor DIV divides by (N−1) instead of by N, as a result of which the frequency fa of clock signal Sa becomes greater. In the last two cases, however, a change of the signal r is caused at the same time, by which the counter C (FIG. 2) is set to zero.

The clock regenerator according to the invention brings about a rapid correction of the phase difference if the clock signals Sa and Sp are not in phase, and at the same time it prevents unnecessary and disturbing corrections when the clock signals Sa and Sp are in phase. Furthermore the clock regenerator functions satisfactorily also when clock signal Sp is jittered.

If all jittered pulse edges fall in zone II, that is, if $n=1$ and $v=1$, the counter C counts toward zero, and no correction is brought about. If there are more pulses in zone III (with $n=0$ and $v=1$) than in zone II (with $n=1$ and $v=1$), the counter status approaches the threshold $+K$ faster, the grater the proportion of pulses lying in zone III is. If there are more pulses in zone I (with $n=1$ and $v=0$) than in zone II, the counter status approaches the threshold $-K$ faster, the greater the proportion of pulses lying in zone I is. If there are pulses only in zone III, the counter status immediately rises to the threshold $+K$; if there are pulses only in zone I, it counts immediately up to the threshold $-K$.

Figure 3:
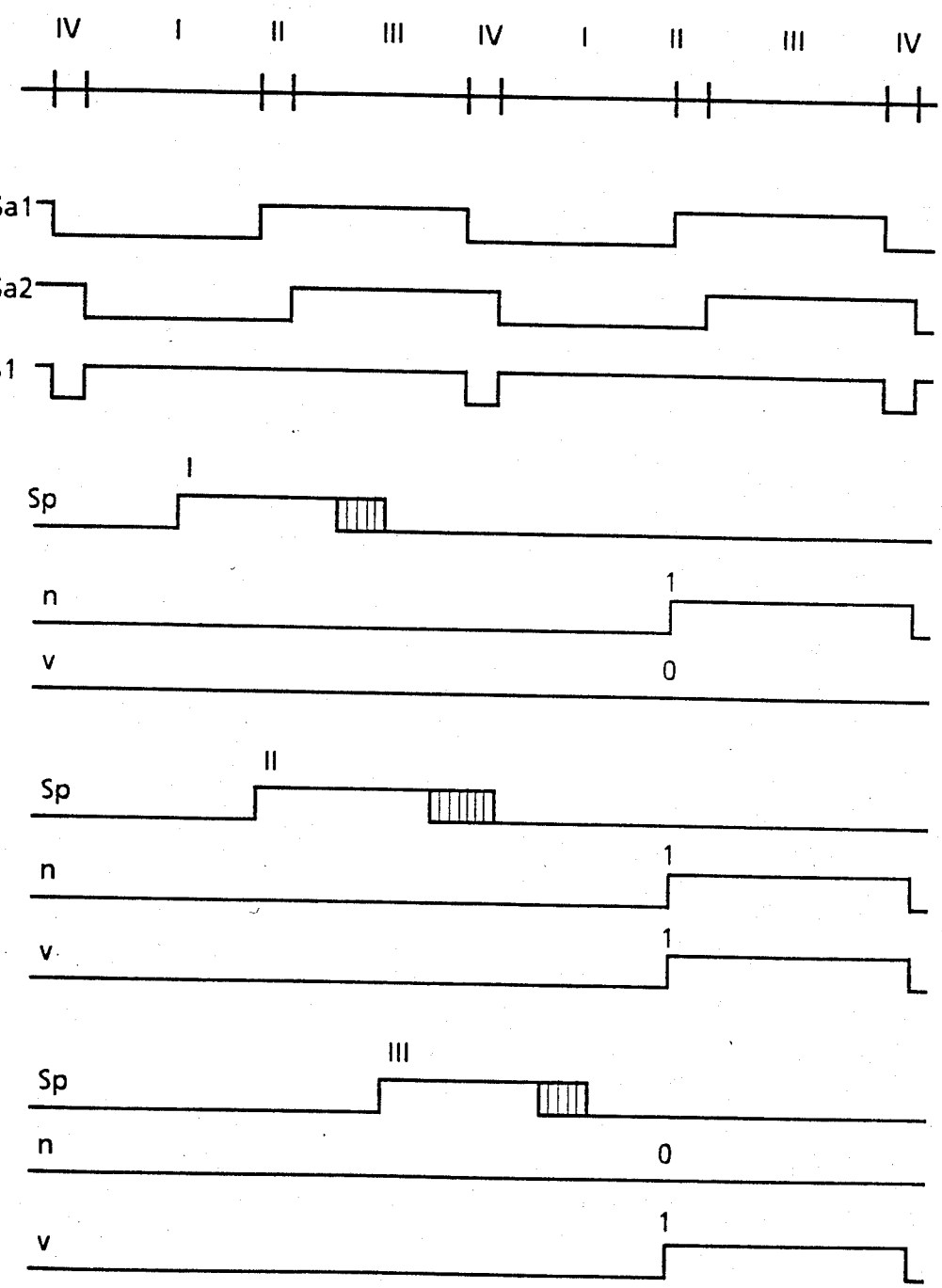
FIG. 3 shows a timing diagram for various signals.
Figure 4:
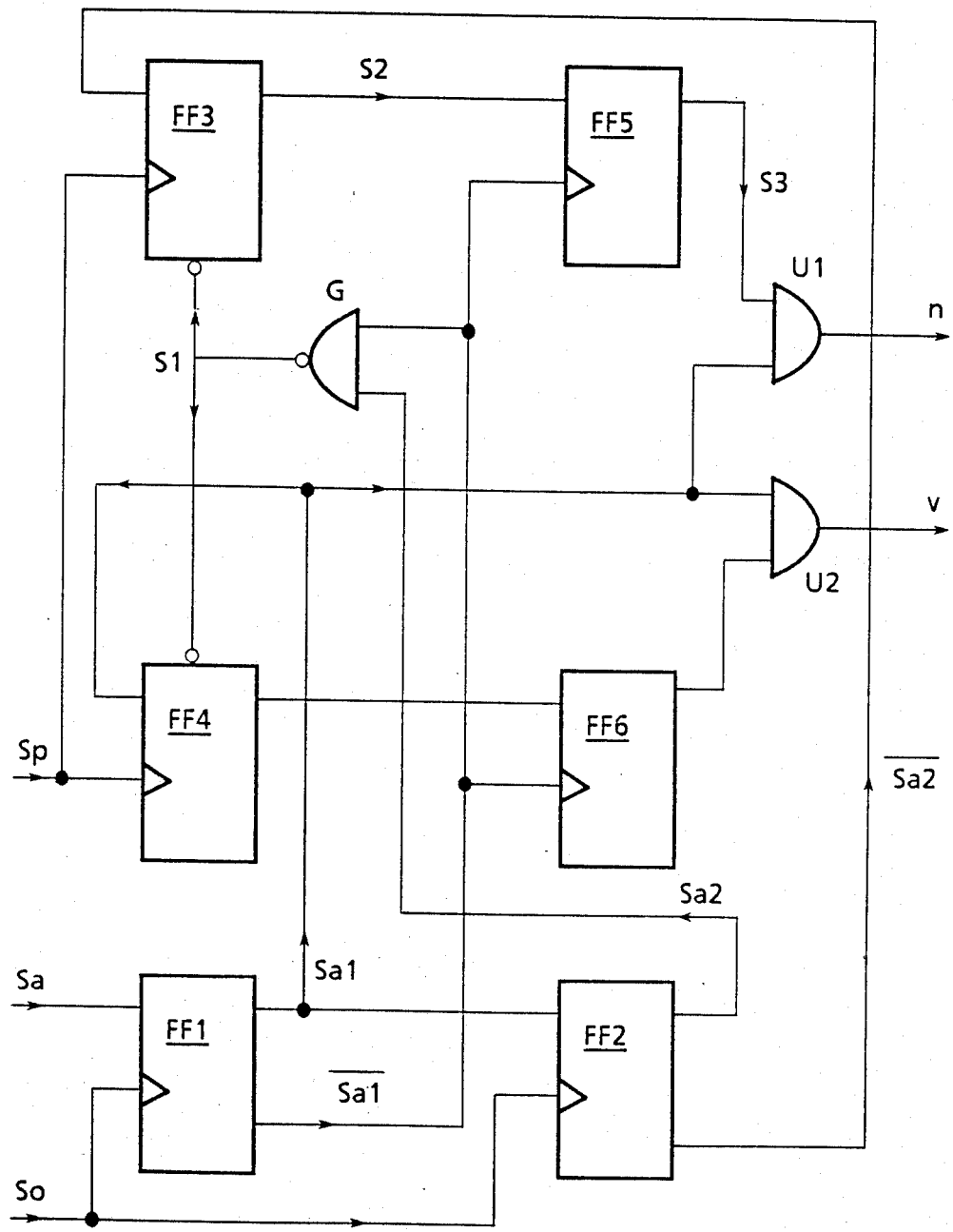
FIG. 4 shows the circuit diagram of a phase detector for such a clock regenerator.

The phase detector shown in FIG. 4 comprises two multivibrators FF1 and FF2 which are responsible for the delay of pulse signal Sa2, as well as four additional multivibrators FF3, FF4, FF5 and FF6, a NAND gate G and two AND gates U1 and U2, which serve to realize Rule I. In FIG. 3 are shown the pulses n and v, which result in the case that the edge of signal Sp falls in zone I, II, or III. For zone IV there applies for a detector according to FIG. 1, $n=0$ and $v=0$. As zone IV is irrelevant, other detectors may be used where $n=0$, $v=1$ or $n=1$, $v=0$.

Lastly let it be noted that with every correction the clock signal Sa is readjusted in phase, for example, by 1/N period, but it will then run away again faster the greater the deviation is between the frequencies fe and fo/N. Hence clock signal Sa is subject to a systematic jitter of the magnitude 1/N period. However, the method according to the invention proves advantageous because without the two clock signals Sa1 and Sa2, a systematic jitter of the magnitude 2/N instead of 1/N period would result.

As a variant of the invention, the counter C may be such that it counts in larger steps than $X=1$ if the counter status is closer to one of the thresholds $+K$ or $-K$ respectively. For this purpose there may be provided, for example, five, seven or more zones. Besides, the divisor DIV can be designed to deliver a plurality of signals of a frequency fa, 2fa, 4fa, ... and/or (i/j) fa, e.g. (6/5) fa. Other embodiments and variations of embodiments should be deemed within the scope of those ordinarily skilled in the art and the invention should only be considered limited by the scope of the claims which follow.

What is claimed is:

1. A clock regenerator comprising:
    a programmable divisor circuit which is connected to the output of an oscillator and having as an output a regenerated signal;
    a comparator circuit having a received input eye signal for transforming said input eye signal into input pulses;
    a phase detector for comparing the regenerated signal with the input pulses by means of an oscillator signal from said oscillator and which provides a lead signal and a lag signal, said phase detector being configured as a phase locked loop having an oscillator frequency of approximately N times higher than the regenerated frequency; and
    a loop filter controlled by the lead and lag signals, wherein:
    the loop filter comprises a first logic circuit which delivers an information signal, a reset signal and control signals;
    a second logic circuit which receives the lead and lag signals and the information signal to indicate the sign and, the direction of the counting status and which provides a counter clock signal and a count direction signal for a counter having a reset input for receiving the signal, and wherein said first logic circuit has an input connected to the output of the counter, and wherein the regenerated signal has at least one delayed signal delayed by L/N periods where L is a low integer, to derive from the delayed signal a pulse window having at least three zones; and output signals of the phase detector represent which zone includes the edge of the input signal; and
    first logic circuit for controlling the programmable divisor such that, when the edges of the input pulses fall in the most central zone of the three zones, the counter counts toward zero and no correction of the output signal is initiated, and wherein the status of said counter is stored in said first logic circuit.

2. A clock regenerator according to claim 1 further including means for detecting when more pulse edges arrive in the first than in the most central zone of the three zones, for causing the counter to count toward a negative threshold and, when this threshold is reached, causing the divisor to divide $N-1$ and to reset counter status to zero, such that, if on the average more pulse edges arrive in the third zone than in the most central zone, the counter is caused to count toward a positive threshold which when reached, causes the divisor to divide by $N+1$ and the counter status to be reset to zero.

3. A clock regenerator according to claim 1 wherein the first logic circuit includes means for delivering a reset signal to reset the counter to zero after one of said two thresholds has been reached.

* * * * *